US012757483B2

(12) United States Patent
Narasimha et al.

(10) Patent No.: US 12,757,483 B2
(45) Date of Patent: Oct. 6, 2026

(54) COMPLEMENTARY FIELD EFFECT TRANSISTOR (CFET) CIRCUITS WITH VERTICAL ROUTING STRUCTURES

(71) Applicant: QUALCOMM Incorporated, San Diego, CA (US)

(72) Inventors: Shreesh Narasimha, Charlotte, NC (US); Yan Sun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 466 days.

(21) Appl. No.: 18/470,226

(22) Filed: Sep. 19, 2023

(65) Prior Publication Data

US 2025/0098221 A1 Mar. 20, 2025

(51) Int. Cl.

| | |
|---|---|
| ***H10D 84/85*** | (2025.01) |
| ***H10D 84/01*** | (2026.01) |
| ***H10W 20/40*** | (2026.01) |

(52) U.S. Cl.

CPC ....... *H10D 84/851* (2025.01); *H10D 84/0186* (2025.01); *H10W 20/481* (2026.01)

(58) Field of Classification Search

CPC ............ H10D 84/0186; H10D 84/851; H10W 20/481

See application file for complete search history.

(56) References Cited

U.S. PATENT DOCUMENTS

| | | | | |
|---|---|---|---|---|
| 11,862,562 | B2 | 1/2024 | Lai et al. | |
| 2021/0407999 | A1 | 12/2021 | Huang et al. | |
| 2022/0059414 | A1* | 2/2022 | Yang | H10D 30/6735 |
| 2022/0123023 | A1 | 4/2022 | Peng et al. | |
| 2022/0262791 | A1 | 8/2022 | Shi et al. | |
| 2022/0328399 | A1 | 10/2022 | Preston et al. | |
| 2022/0336325 | A1 | 10/2022 | Lai et al. | |
| 2022/0375935 | A1 | 11/2022 | Yim et al. | |
| 2023/0067311 | A1 | 3/2023 | Lai et al. | |
| 2023/0068280 | A1 | 3/2023 | Lin et al. | |
| 2023/0101678 | A1 | 3/2023 | Chu et al. | |
| 2023/0178554 | A1 | 6/2023 | Chehab et al. | |
| 2023/0284427 | A1 | 9/2023 | Augustine et al. | |

(Continued)

OTHER PUBLICATIONS

International Search Report and Written Opinion—PCT/US2024/043978—ISA/EPO—Dec. 3, 2024.

(Continued)

*Primary Examiner* — Peter M Albrecht

(74) *Attorney, Agent, or Firm* — Loza & Loza, LLP

(57) ABSTRACT

Disclosed are complementary field effect transistor (CFET) circuits with vertical routing structures and methods for making the same. In an aspect, a semiconductor structure comprises a first field effect transistor (FET) of a first charge carrier type, comprising a first source/drain (S/D) region, a second S/D region, and a first gate; a second FET of a second charge carrier type, disposed above the first FET and comprising a third S/D region, a fourth S/D region, and a second gate; a frontside metal (FM) layer disposed above the second FET and comprising an FM conductor extending in an X direction; a backside metal (BM) layer disposed below the first FET and comprising a BM conductor extending in the X direction; and a vertical connector extending in the Z direction, that electrically couples the BM conductor to the FM conductor.

19 Claims, 11 Drawing Sheets

(56) References Cited

U.S. PATENT DOCUMENTS

| | | | |
|---|---|---|---|
| 2024/0266290 | A1 | 8/2024 | Kang |
| 2024/0266344 | A1 | 8/2024 | Lee et al. |
| 2024/0321337 | A1 | 9/2024 | Lin et al. |

OTHER PUBLICATIONS

Kobrinsky M., et al., "Novel Cell Architectures with Back-side Transistor Contacts for Scaling and Performance", Symposium on VLSI Technology and Circuits Digest of Technical Papers, 2023, pp. 1-2.

* cited by examiner

COMPLEMENTARY FIELD EFFECT TRANSISTOR (CFET) CIRCUITS WITH VERTICAL ROUTING STRUCTURES

BACKGROUND OF THE DISCLOSURE

1. Field of the Disclosure

Aspects of the disclosure relate generally to high performance devices, and more specifically to semiconductor structures for complementary field effect transistors (CFETs).

2. Description of the Related Art

Integrated circuit technology has achieved great strides in advancing computing power through miniaturization components such as semiconductor transistors. The progression of semiconductors have progressed from bulk substrates and planar CMOS, FinFETs, nanowires or nanoribbons (also called nanosheets), to nanowire or nanoribbon 3D stacking. The semiconductor technologies have largely been based on silicon. However, fabrication of transistors based on silicon may be problematic when it comes to further reduction in scaling, e.g., to few nanometers. Accordingly, there is a need for systems, apparatus, and methods that overcome the deficiencies of conventional devices including the methods, system and apparatus provided herein.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a semiconductor structure includes at least one complementary field effect transistor (CFET) structure, comprising: a first field effect transistor (FET) of a first charge carrier type, comprising a first source/drain (S/D) region, a second S/D region, and a first gate; a second FET of a second charge carrier type, disposed above the first FET in a Z direction (e.g., a vertical direction) and comprising a third S/D region, a fourth S/D region, and a second gate; a frontside (FS) metal (FM) layer disposed above the second FET in the Z direction and comprising an FM conductor extending in an X direction (e.g., a first horizontal direction); a backside (BS) metal (BM) layer disposed below the first FET in the Z direction and comprising a BM conductor extending in the X direction; and a vertical connector extending in the Z direction, wherein the vertical connector electrically couples the BM conductor to the FM conductor.

In an aspect, a semiconductor structure includes an FM layer comprising a plurality of FM conductors extending in an X direction and separated from each other along a Y direction (e.g., a second horizontal direction perpendicular to the first horizontal direction); a BM layer disposed below the FM layer in a Z direction and comprising a plurality of BM conductors extending in the X direction and separated from each other along the Y direction; and a vertical connector extending in the Z direction, wherein the vertical connector electrically couples a first BM conductor of the plurality of BM conductors to a first FM conductor of the plurality of FM conductors.

In an aspect, a method of fabricating a semiconductor structure includes providing at least one CFET structure, comprising: providing a first FET of a first charge carrier type, comprising a first S/D region, a second S/D region, and a first gate; providing a second FET of a second charge carrier type, disposed above the first FET in a Z direction and comprising a third S/D region, a fourth S/D region, and a second gate; providing an FM layer disposed above the second FET in the Z direction and comprising an FM conductor extending in an X direction; providing a vertical connector extending in the Z direction and being electrically coupled to the FM conductor; and providing a BM layer disposed below the first FET in the Z direction and comprising a BM conductor extending in the X direction and being electrically coupled to the vertical connector.

In an aspect, a method of fabricating a semiconductor structure includes providing an FM layer comprising a plurality of FM conductors extending in an X direction and separated from each other along a Y direction; providing a vertical connector extending in a Z direction and being electrically coupled to one of the plurality of FM conductors; and providing a BM layer disposed below the FM layer in the Z direction and comprising a plurality of BM conductors extending in the X direction and separated from each other along the Y direction, one of the plurality of BM conductors being electrically coupled to the vertical connector.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

Figure 1:
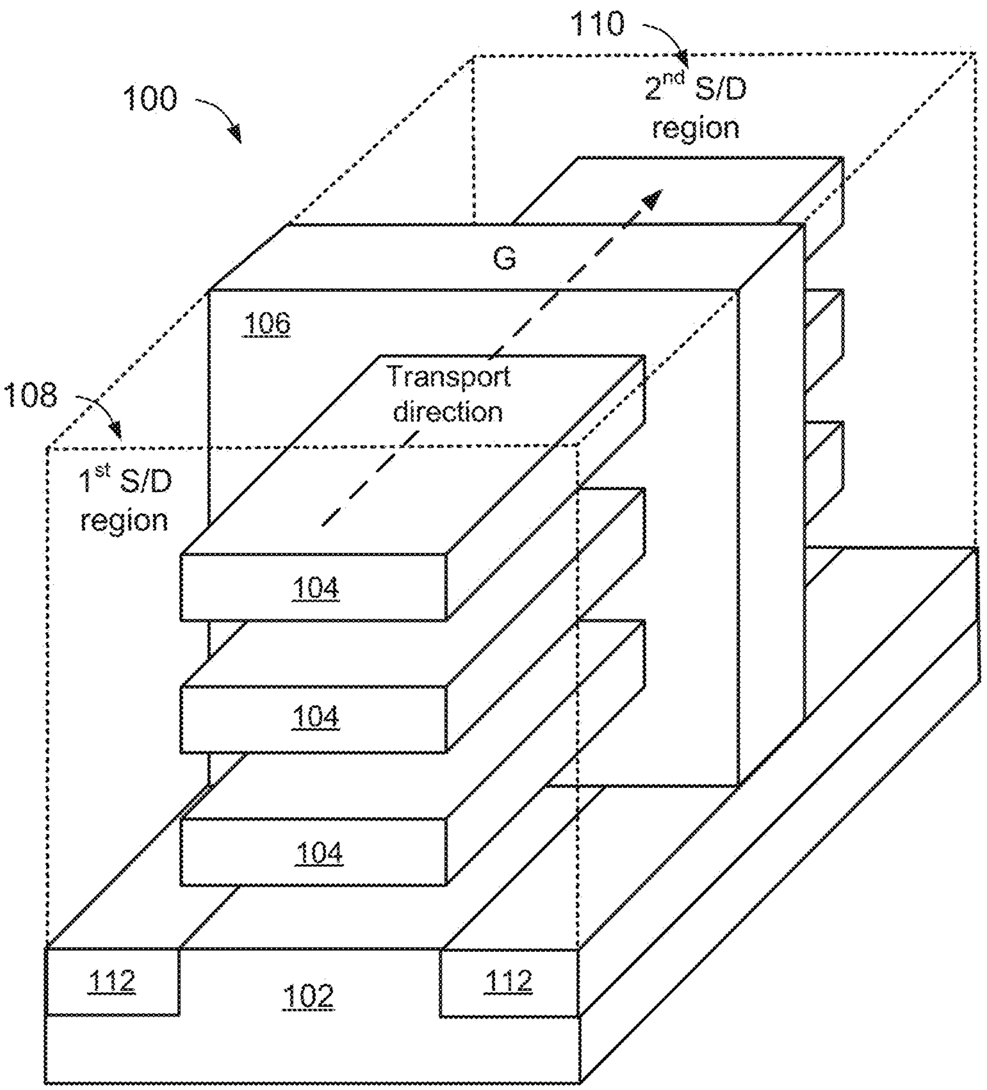
FIG. 1 illustrates a nanosheet field effect transistor (FET).

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Disclosed are complementary field effect transistor (CFET) circuits with vertical routing structures and methods for making the same. In an aspect, a semiconductor structure comprises a first field effect transistor (FET) of a first charge carrier type, comprising a first source/drain (S/D) region, a second S/D region, and a first gate; a second FET of a second charge carrier type, disposed above the first FET and comprising a third S/D region, a fourth S/D region, and a second gate; a frontside metal (FM) layer disposed above the second FET and comprising an FM conductor extending in an X direction; a backside metal (BM) layer disposed below the first FET and comprising a BM conductor extending in the X direction; and a vertical connector extending in the Z direction, that electrically couples the BM conductor to the FM conductor.

This provides at least the advantage that backside power can be routed from a BM layer to a FM layer within an integrated circuit device itself without the use of higher level frontside or backside metal layers, allowing the higher level metal layers to be used for other purposes and allowing circuits to be efficiently implemented in compact standard cells, e.g., 4T and 3T cells.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words “exemplary” and/or “example” are used herein to mean “serving as an example, instance, or illustration.” Any aspect described herein as “exemplary” and/or “example” is not necessarily to be construed as preferred or advantageous over other aspects. Likewise, the term “aspects of the disclosure” does not require that all aspects of the disclosure include the discussed feature, advantage or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, “logic configured to” perform the described action.

FIG. 1 illustrates a nanosheet field effect transistor (FET) 100. The nanosheet FET 100 shown in FIG. 1 is built upon a silicon substrate 102 and comprises a set of three nanosheets 104 that extend through a gate-all-around (GAA) structure 106. One end of the three nanosheets 104 are electrically connected together in a first epitaxial (EPI) structure (not shown) to form a first source/drain (S/D) region 108, and the other end of the three nanosheets 104 are electrically connected together in a second EPI structure (also not shown) to form a second S/D region 110. The gate structure is isolated from the substrate 102 by oxide isolation regions 112. The structure can be adapted so that the substrate 102 is removed entirely, to facilitate backside connectivity. The nanosheets 104 are the channels by which the charge carrier travels through the GAA structure 106 to get from the first S/D region 108 to the second S/D region 110, and thus may be referred to herein as “nanosheet channels”. Although not shown in FIG. 1 for simplicity, the nanosheets 104 are electrically insulated from the GAA structure 106 by a dielectric layer that surrounds the portions of the nanosheets 104 that go through the GAA structure 106.

For each pair of S/D regions on either side of a gate, one S/D region may operate as the source and the other S/D region may operate as the drain, or vice-versa. Generally, the term “source” is used to refer to the S/D region that is tied to the source of the charge carrier (i.e., for a PFET, the S/D region tied to VDD; for an NFET, the S/D region tied to VSS), and thus whether the first S/D region 108 or the second S/D region 110 is the source depends on the specific electrical connection made to each.

Figure 2:
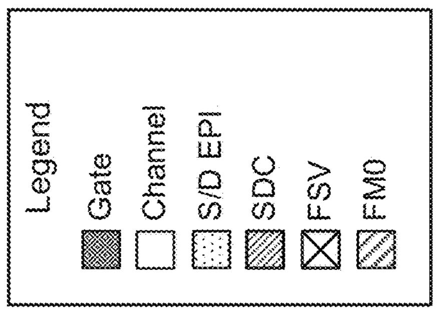
FIG. 2 is a plan view of a conventional standard cell.
Figure 2:
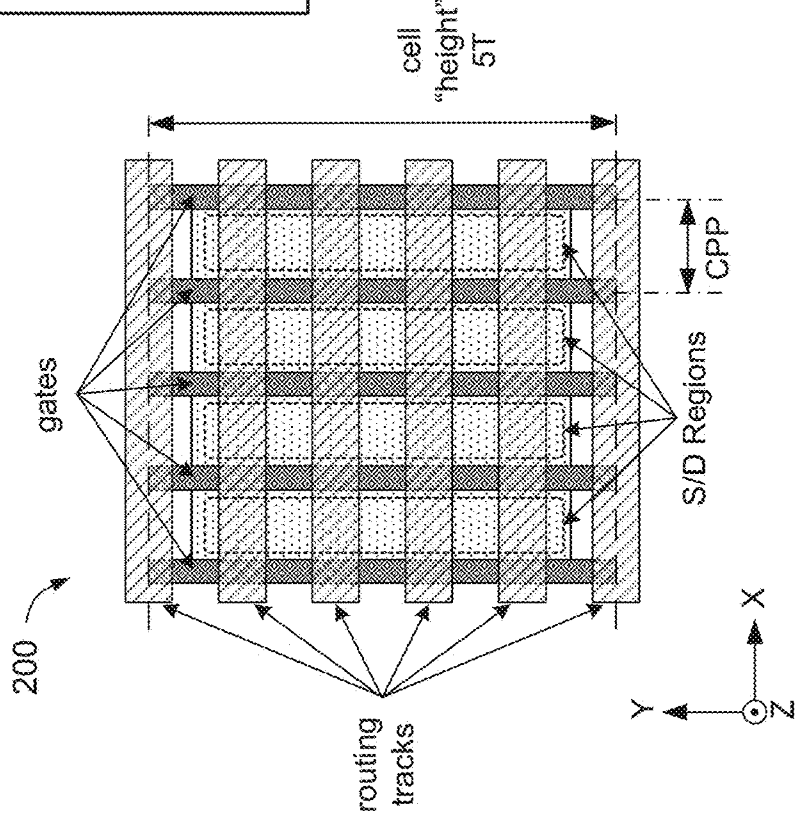

FIG. 2 is a plan view of a conventional standard cell 200 having gates extending along a Y direction and spaced apart from each other along an X direction and having frontside routing tracks extending along the X direction and spaced apart from each other along the Y direction. Contacted poly pitch (CPP) is the distance separating the centers of adjacent gates. The standard cell shown in FIG. 2 is “track-aligned”, meaning that routing tracks at the top and bottom of the figure are shared with standard cells adjacent to the cell 200 in the Y direction and are typically used for power and ground. The cell 200 shown in FIG. 2 is a "5T" cell, which has four internal routing tracks, where "internal" refers to the fact that they are between the routing tracks at the top and bottom of the figure and are used for routing between structures internal to the standard cell (rather than being power and ground buses). As shown in FIG. 2, an EPI structure, which may also be referred to herein as an EPI layer, occupies the space between the gates, and forms a set of S/D regions, one on each side of a gate. As such, an S/D region may also be referred to herein as an S/D EPI region. The location of the EPI structure and the S/D regions within is illustrative.

Figure 3:
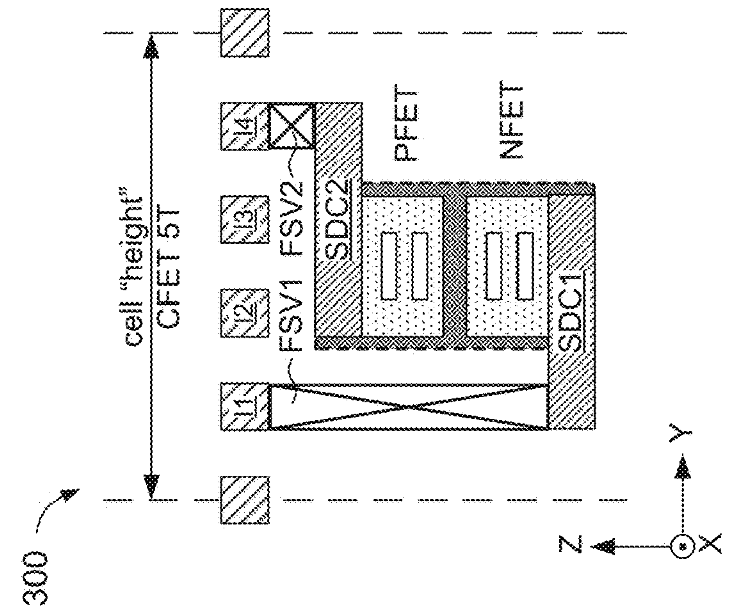
FIG. 3 is a cross-sectional view of a conventional monolithic complementary FET (CFET).

FIG. 3 is a cross-sectional view of a conventional monolithic complementary FET (CFET) 300 comprising a pair of nanosheet FETs stacked vertically. FIG. 3 illustrates a cross section though the gate structure, where the current goes into or out of the page, depending on the charge carrier. In the example shown in FIG. 3, the CFET 300 includes a nanosheet p-channel FET structure (PFET) above a nanosheet n-channel FET structure (NFET) in a Z direction. The four frontside internal routing tracks are labeled I1 through I4. A first frontside via, FSV1, connects routing track I1 to a first source/drain (S/D) contact (SDC), SDC1. A second frontside via, FSV2, connects routing track I4 to a second S/D contact, SDC2. FIG. 3 illustrates a disadvantage of the design of CFET 300, namely, that because the bottom FET in the vertical CFET stack—an NFET in the case of CFET 300—must have an electrical connection to a frontside routing track, this means that there are fewer internal routing tracks available for making other internal connections within a standard cell, which raises the minimum number of internal tracks needed to successfully route circuits within a complex standard cell. In FIG. 3, for example, complex standard cells using frontside-only routing tracks must have at least four internal routing tracks, which means that the cell must be at least a 5T or 6T design rather than a 4T or 3T design. To use less than four internal routing tracks would require the cell to expand in the X direction to accommodate internal connections, would require the use of higher-level metal structures above the standard cell to connect internal structures of the standard cell to each other, or both—thus negating the potential advantages of a cell height reduction.

Figure 4:
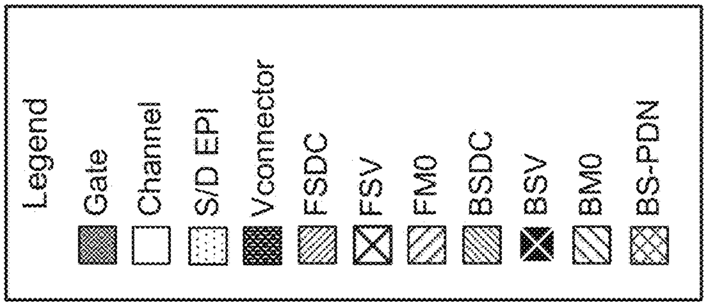
FIG. 4 is a cross-sectional view of an improved standard cell with a backside power distribution network (BS-PDN), according to aspects of the disclosure.
Figure 4:
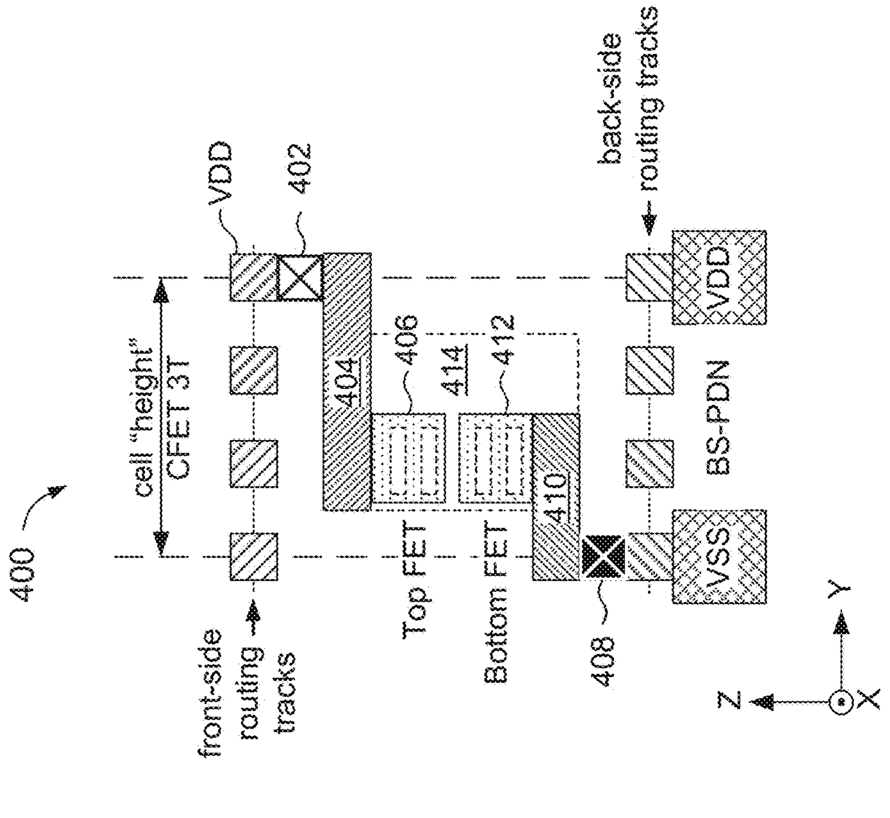

FIG. 4 is a cross-sectional view of an improved standard cell 400 with a backside power distribution network (BS-PDN), according to aspects of the disclosure. In the example shown in FIG. 4, the cell 400 includes a CFET comprising a top FET above a bottom FET in the Z direction. For the purposes of illustration, it may be presumed for FIG. 4 and subsequent figures that the top FET is a PFET and the bottom FET is an NFET, but it will be understood that the same principles and techniques disclosed herein may be used for circuits having the top FET being an NFET and the bottom FET being a PFET.

In the example shown in FIG. 4, the cell 400 has both frontside routing tracks and backside routing tracks. Because of dense routing track availability on both front and back sides, the cell height can be reduced compared to the frontside-only standard cell design in FIG. 3: in FIG. 4, the standard cell 400 is a 3T design. A frontside via (FSV) 402 connects a frontside routing track to a frontside source/drain contact (FSDC) 404 that provides VDD to an S/D region 406 of the PFET, and a backside via (BSV) 408 connects a backside routing track to a backside source/drain contact (BSDC) 410 that provides VSS to an S/D region 412 of the NFET that is below the S/D region 406 of the PFET. Because the gate 414 is out of the plane of the cross-section, it is shown with a dashed outline. However, since the entirety of the PDN emanates from the back, the VDD delivered from the frontside routing track must also be provided from the backside.

Figure 5:
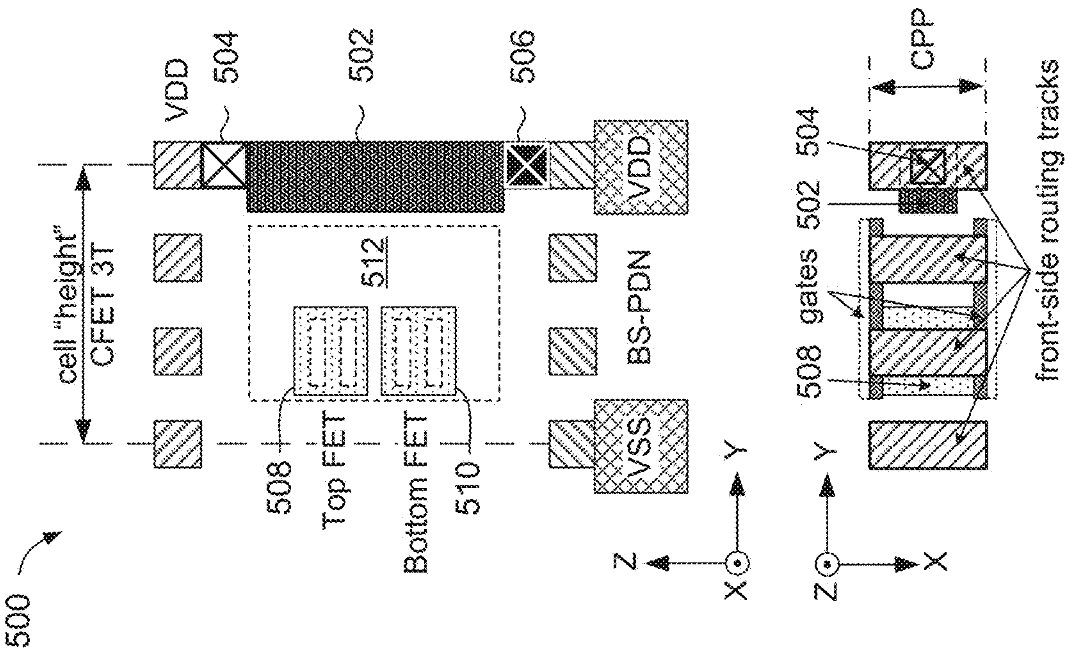
FIG. 5 shows both a cross-sectional view and a plan view of a staple cell that may be used to provide VDD from a backside routing track to a frontside routing track, according to aspects of the disclosure.

FIG. 5 shows both a cross-sectional view and a plan view of a staple cell 500 that may be used to provide VDD from a backside routing track to a frontside routing track, according to aspects of the disclosure. In the example shown in FIG. 5, the staple cell 500 is a 3T standard cell design, but the same principles may be applied to a 2T standard cell design, a 4T standard cell design, etc. As shown in FIG. 5, the staple cell 500 includes a vertical connector 502 that is coupled to a frontside routing track through a FSV 504 and is coupled to a backside routing track through a BSV 506. This allows VDD to be provided from a BS-PDN to a frontside routing track. The cross-section in FIG. 5 shows the channels within an S/D region 508 of the top FET and within an S/D region 510 of the bottom FET. FIG. 5 also shows the gate 512, which is a GAA structure having stacks of nano-sheet channels, all of which are out-of-plane and therefore shown using dashed lines.

In some aspects, the vertical connector 502 is fabricated using a combination of middle-of-line (MOL) process steps and back end of line (BEOL) processes steps, with the result that the vertical connector is located between the frontside metal zero layer and the backside metal zero layer, rather than above the frontside metal zero layer or below the backside metal zero layer. This provides at least the advantage that backside power can be routed to a frontside M0 (FM0) layer within an integrated circuit device itself without the use of higher level frontside or backside metal layers.

For example, the vertical connector 502 may be fabricated with etch and fill steps that can be part of a frontside process, a backside process, or both. In some aspects, the vertical connector is made by etching, filling, and planarizing the vertical connector as part of a frontside process. After that, a FSV may be formed. The process then includes flipping the substrate, grinding the substrate to reveal the back surface of the vertical connector, and forming a BSV to the exposed back surface of the vertical connector. In other aspects, the FSV is formed, the substrate is flipped and ground, and the vertical connector is made by etching the substrate to expose the back of the FSV, filling the hole to create the vertical connector, and planarizing the vertical connector as part of the backside process. After that, the BSV may be formed on the planarized surface of the vertical connector. It will be appreciated that the vertical connector may be made by other combinations of MOL and back end of line (BEOL) steps.

As can be seen in the plan view of the staple cell 500, shown at the bottom of FIG. 5, in some aspects, the vertical connector 502 has an X dimension that is approximately the same as a Y dimension (e.g., the vertical connector 502 has an approximately square profile in plan view), i.e., the vertical connector 502 is not a trench structure, which typically has a long X dimension. For example, some trench structures extend the length of a standard cell in the X direction. In some aspects, the X dimension of the vertical connector is less than the CPP. Moreover, unlike a traditional trench structure, which is connected only to a frontside routing track, the vertical connector 502 is electrically coupled to both a frontside routing track and a backside routing track.

Figure 6:
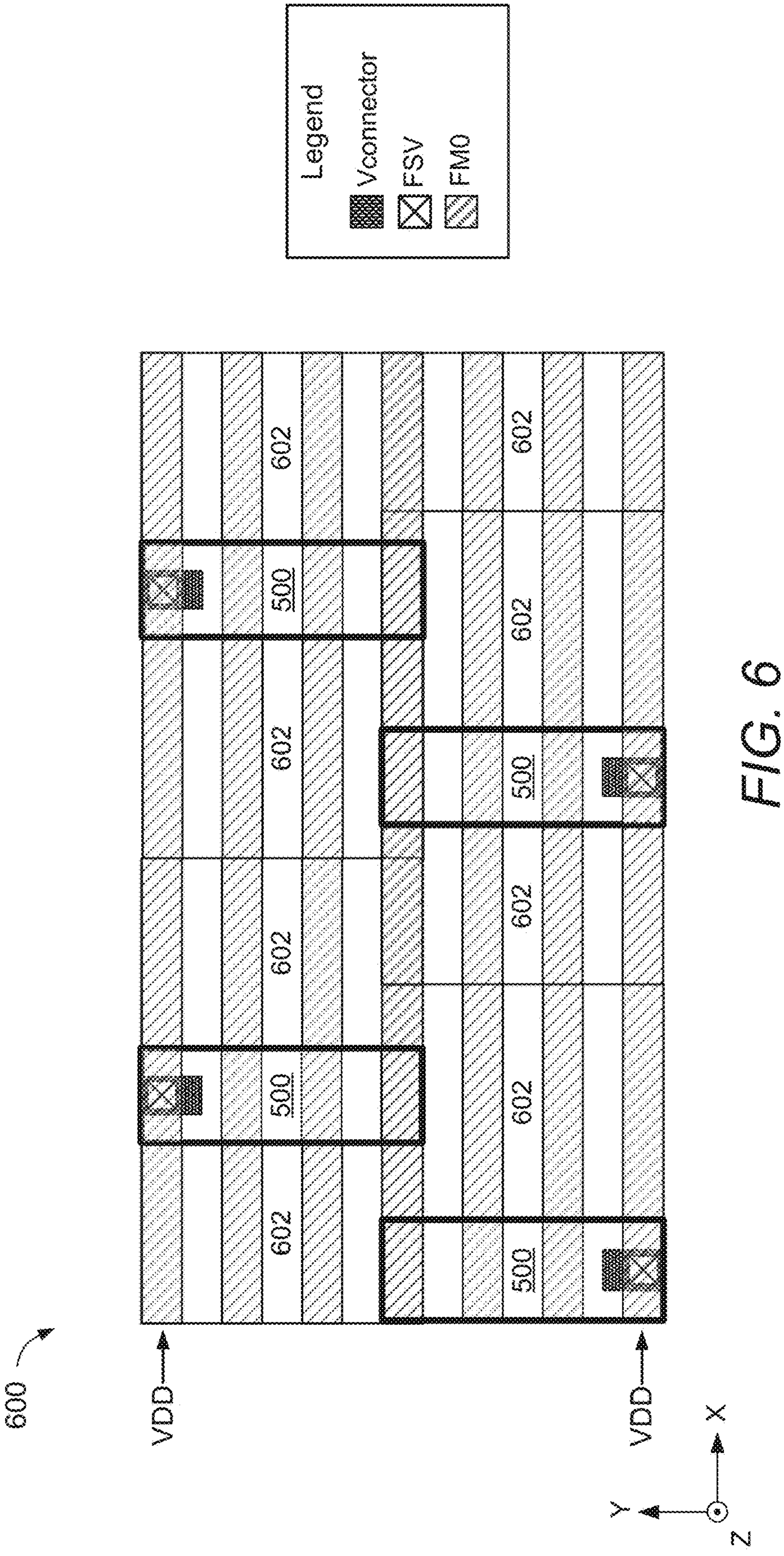
FIG. 6 is a plan view of an example standard cell layout using multiple instances of a staple cell, according to aspects of the disclosure.

FIG. 6 is a plan view of an example standard cell layout 600 using multiple instances of staple cell 500, interspersed between logic cells 602, according to aspects of the disclosure. In the example shown in FIG. 6, the staple cells 500 are placed to provide periodic connections of VDD from a BS-PDN to frontside routing tracks, which are labeled as "VDD" in FIG. 6. In some aspects, a staple cell 500 may be automatically placed, e.g., via an automatic place and route tool, in order to guarantee that the distance between two backside VDD to frontside VDD connections will never be larger than some predefined value. For implementations that have the NFET above the PFET, the staple cell 500 may be used to provide periodic connections of VSS from a PS-BDN to frontside routing tracks, which would supply VSS to NFETs through an FSV and FSDC.

Because the vertical connector 502 is not a trench structure (e.g., vertical connector 502 does not extend in the X direction parallel to the routing tracks), in some aspects, it can be opportunistically placed within pre-existing integrated cells, e.g., taking advantage of a relatively empty section of a standard cell.

Figure 7:
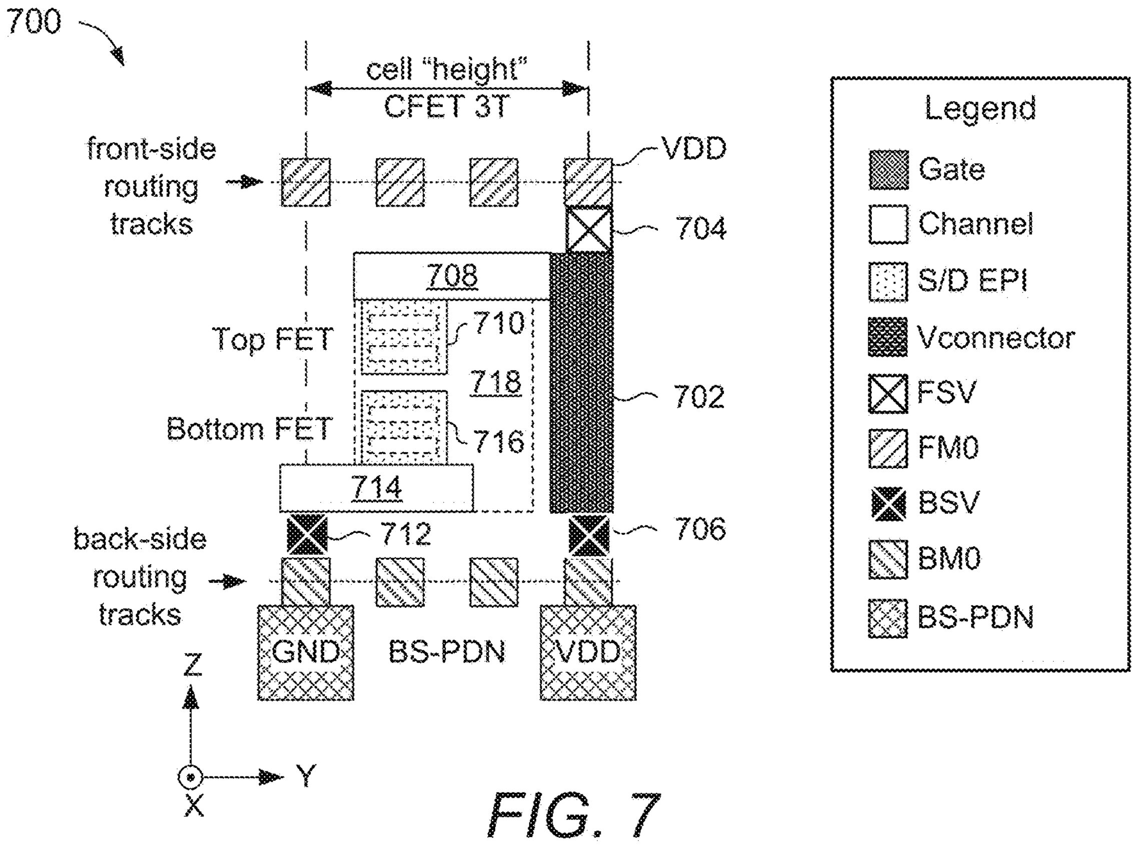
FIG. 7 is a cross-sectional view of an example standard cell comprising an opportunistic vertical connector, according to aspects of the disclosure.

FIG. 7 is a cross-sectional view of a semiconductor structure of an integrated circuit cell 700 in which an opportunistic vertical connector 702 has been instantiated along with a CFET structure comprising a top FET of a first charge carrier type, a bottom FET of a second charge carrier type, a set of FM0 conductors, and a set of backside M0 (BM0) conductors. The opportunistic vertical connector 702 electrically couples one of the BM0 conductors to one of the FM0 conductors, e.g., using a FSV 704 and a BSV 706. In the example shown in FIG. 7, the vertical connector 702 provides VDD through an FSDC 708 to an S/D region 710 of the top FET. In the example shown in FIG. 7, VSS is provided from a BM0 conductor through a BSV 712 and a BSDC 714 to an S/D region 716 of the bottom FET. In this cross-sectional view, elements not in the Y-Z plane of the vertical connector 702 are illustrated using dashed lines. FIG. 7 also shows the gate 718, which is a GAA structure having stacks of nano-sheet channels, all of which are out-of-plane and therefore shown using dashed lines.

In one aspect, an automatic place and route (APR) tool can place and route a set of standard cells to form a block of circuitry, and then analyze the resulting circuit to see if there are any places within the block in which an opportunistic vertical connector 702 could be placed. If so, the vertical connector 702, along with FSV and BSV, are placed into available spaces as needed, e.g., to satisfy some minimum distance between two backside to frontside VDD connections along a frontside routing track supplying VDD.

Figure 8:
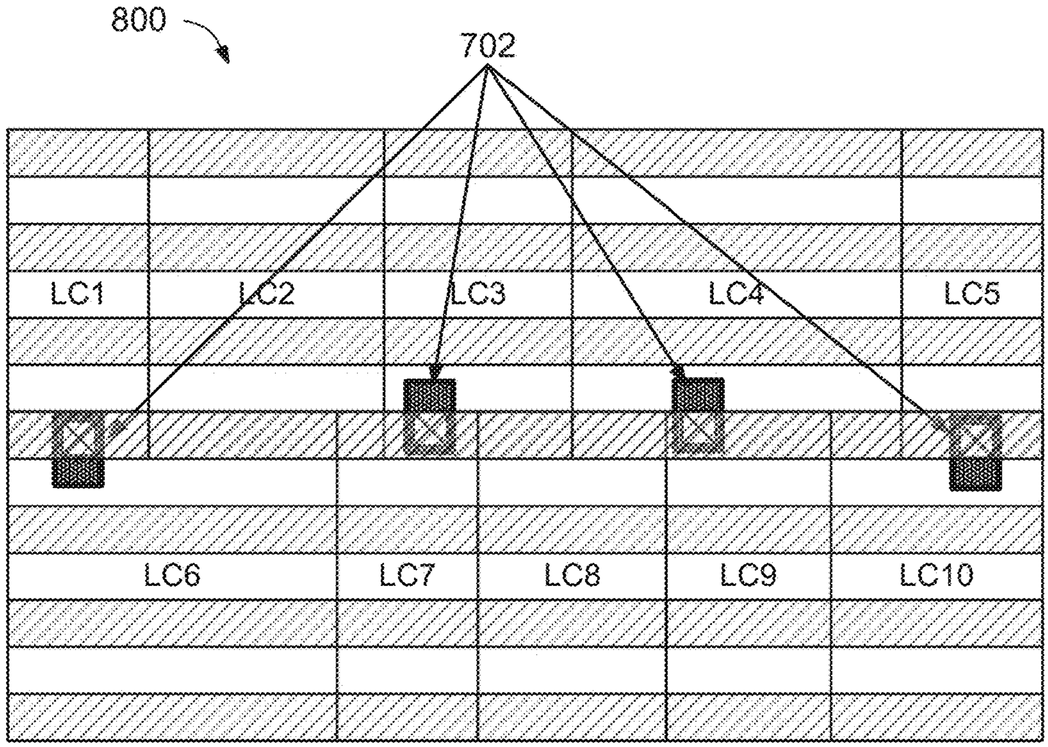
FIG. 8 is a plan view of an example standard cell layout comprising a plurality of opportunistic vertical connectors, according to aspects of the disclosure.

FIG. 8 is a plan view of a semiconductor structure of an integrated circuit 800 comprising opportunistic vertical connectors 702, placed within logic cells as needed and as possible, according to aspects of the disclosure. In the example shown in FIG. 8, an opportunistic vertical connector 702 has been placed in each of logic cell 3 (LC3), logic cell 4 (LC4), logic cell 6 (LC6), and logic cell 10 (LC10), e.g., by an APR tool after an initial place and route operation.

In some aspects, if there are too few opportunities for opportunistic vertical connectors—e.g., with the result that the distance between a pair of adjacent backside to frontside VDD connections is too great, then the APR tool can adjust the layout, e.g., by inserting a staple cell 500 where needed, with or without maintaining the existing opportunistic vertical connectors 702 that were previously inserted into the layout.

Figure 9:
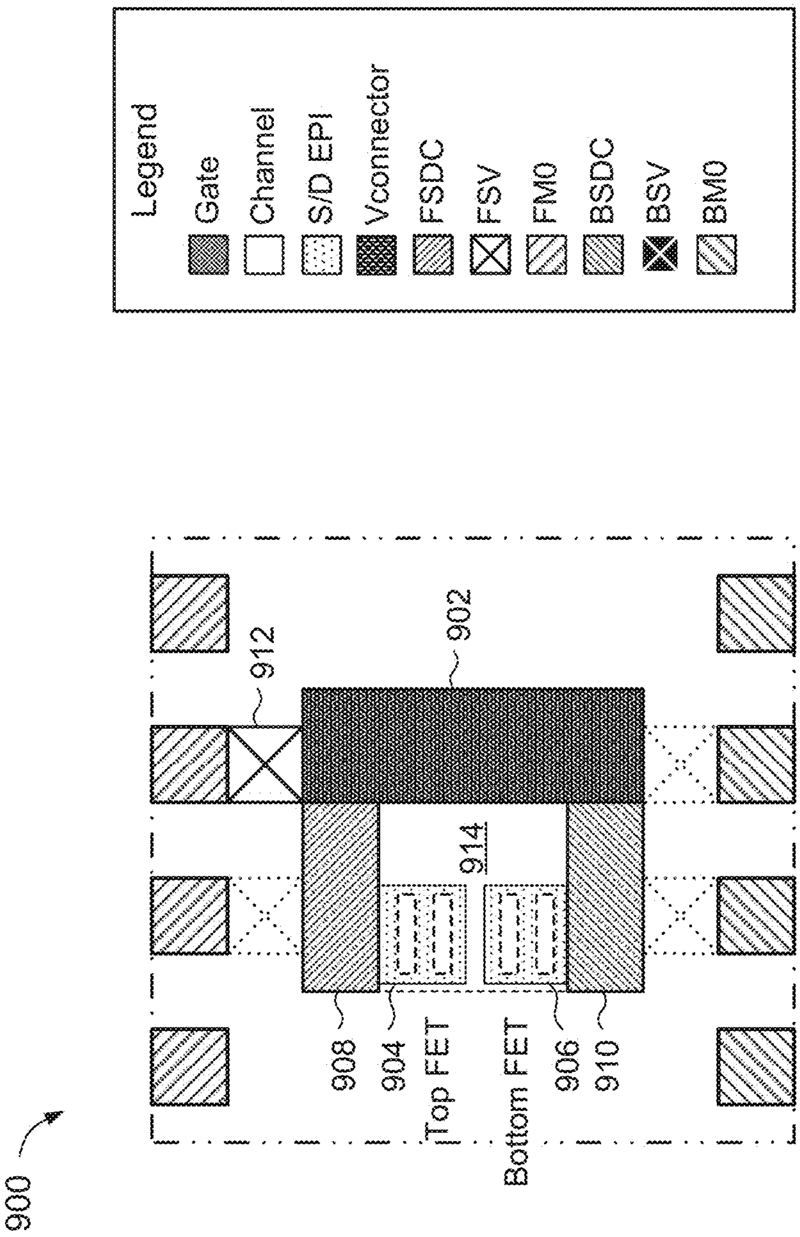
FIG. 9 is a cross-sectional view of an example standard cell in which a vertical connector is used for an internal connection within the cell, according to aspects of the disclosure.

FIG. 9 is a cross-sectional view of a semiconductor structure of an integrated circuit cell 900 in which a vertical connector 902 is used for an internal connection within the cell 900, according to aspects of the disclosure. In this cross-sectional view, elements not in the Y-Z plane of the vertical connector 902, such as the PFET/NFET channels, are illustrated using dashed lines. In the example shown in FIG. 9, the vertical connector 902 connects an S/D region 904 of the top FET to an S/D region 906 of the bottom FET, via an FSDC 908 and a BSDC 910, respectively, and provides the signal to one of the FM0 conductors through a FSV 912. The gate 914 is out-of-plane and thus shown using dashed lines. If the top and bottom FETs are part of an inverter, the vertical connector 902 is the output of the inventor, and so this vertical connector 902 may be referred to as an "output" vertical connector 902. In FIG. 9, the output signal provided by the vertical connector 902 is supplied to one of the FM0 conductor, but it is noted that it may also, or alternatively, be supplied to another of the FM0 conductors, and/or one or more of the BM0 conductors, e.g., using a FSV or BSV at any of the locations indicated by dotted lines in FIG. 9.

Figure 10A:
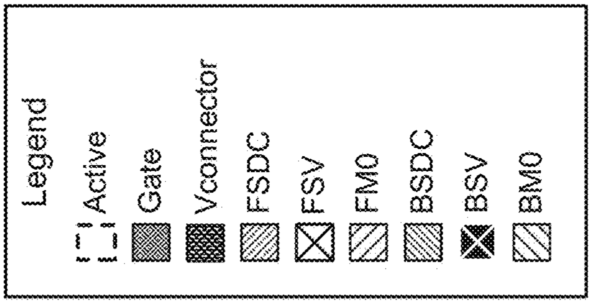
FIG. 10A and FIG. 10B show plan views of an example integrated circuit that illustrates the use of a staple cell, an opportunistic vertical connector, and an output vertical connector, according to aspects of the disclosure.
Figure 10A:
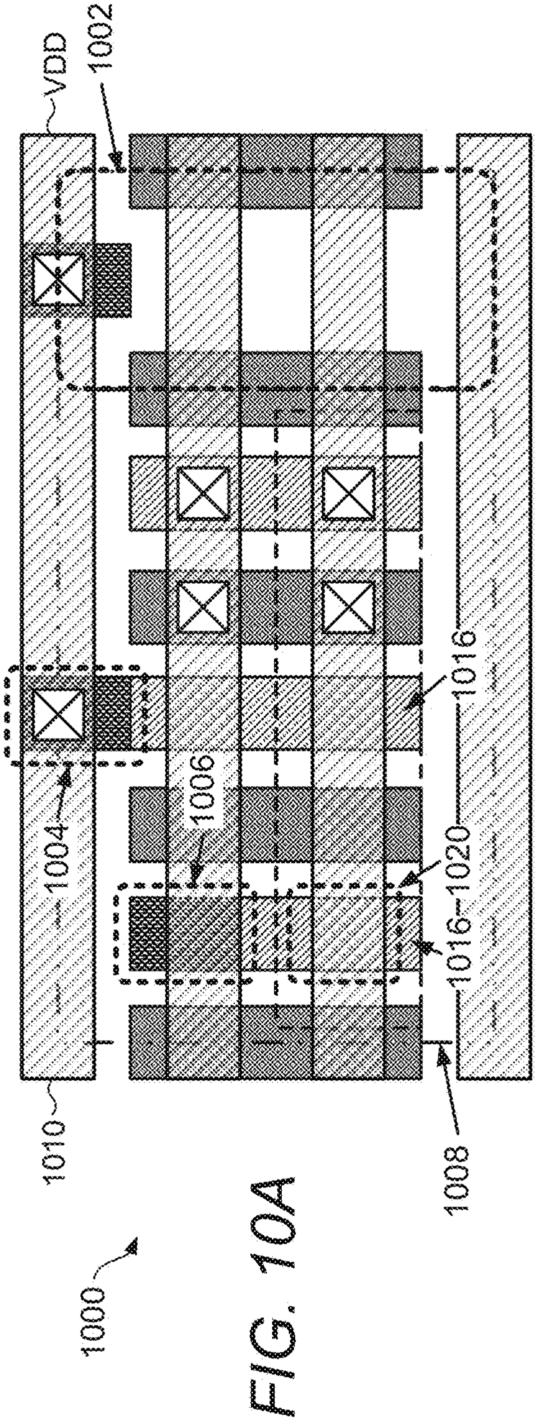
Figure 10B:
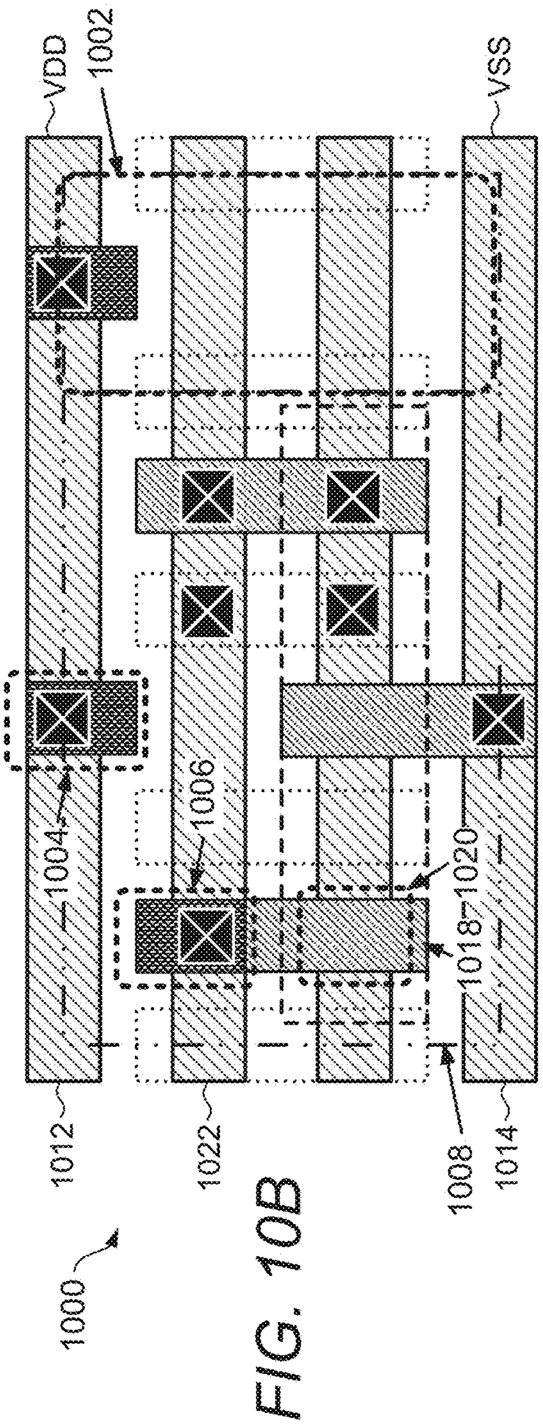

FIG. 10A and FIG. 10B show plan views of an example integrated circuit 1000 that illustrates the use of a staple cell 1002, and also illustrates an opportunistic vertical connector 1004 and an output vertical connector 1006 that are part of a logic cell 1008, according to aspects of the disclosure. FIGS. 10A and 10B are intended to illustrate topology and connectivity. They are not intended to illustrate any specific logic function. FIG. 10A shows the frontside connections of the integrated circuit 1000 and FIG. 10B shows the backside connections of the integrated circuit 1000.

In the example shown in FIG. 10A and FIG. 10B, the staple cell 1002 includes a vertical connector that is electrically coupled to an FM0 conductor 1010 by an FSV and is electrically coupled to a BM0 conductor 1012 by a BSV. In this example, the BM0 conductor 1012 is electrically coupled to VDD through a backside power distribution network (BS-PDN), not shown, and the BM0 conductor 1014 is electrically coupled to VSS through the BS-PDN.

In the example shown in FIG. 10A and FIG. 10B, the opportunistic vertical connector 1004 is also electrically coupled to the FM0 conductor 1010 by an FSV and to the BM0 conductor 1012 by a BSV. In this example, the opportunistic conductor provides VDD to the FM0 conductor 1010.

In the example shown in FIG. 10A and FIG. 10B, the output vertical connector 1006 connects a FSDC 1016 and a BSDC 1018 that connect to respective FETs in a CFET structure 1020. In this example, the output vertical connector 1006 is also electrically coupled to another BM0 conductor 1022 by a BSV, but in alternative aspects, the output vertical connector 1006, the FSDC 1016, and/or the BSDC 1018 could be electrically coupled to other FM0 conductors and/or BM0 conductors.

Figure 11:
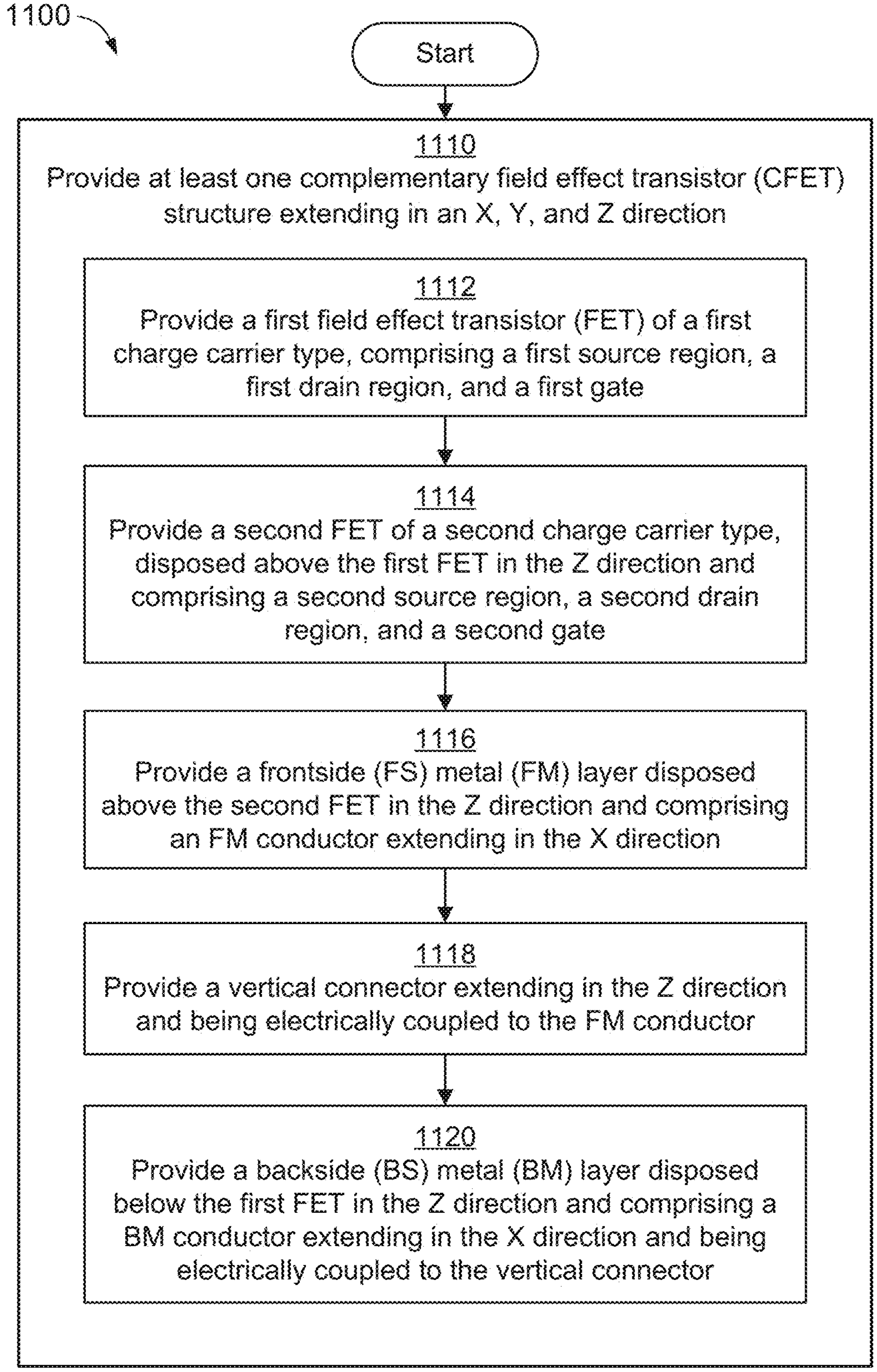
FIG. 11 is a flowchart of an example process for fabricating CFET circuits with vertical routing structures, according to aspects of the disclosure.

FIG. 11 is a flowchart of an example process 1100 for fabricating CFET circuits with vertical routing structures, according to aspects of the disclosure. As shown in FIG. 11, process 1100 may include, at 1110, providing at least one CFET structure extending in an X, Y, and Z direction.

As shown in FIG. 11, 1110 may comprise, at 1112, providing a first FET of a first charge carrier type, comprising a first S/D region, a second S/D region, and a first gate.

As shown in FIG. 11, 1110 may comprise, at 1114, providing a second FET of a second charge carrier type, disposed above the first FET in a Z direction and comprising a third S/D region, a fourth S/D region, and a second gate.

As shown in FIG. 11, 1110 may comprise, at 1116, providing a frontside FM layer disposed above the second FET in the Z direction and comprising an FM conductor extending in an X direction.

As shown in FIG. 11, 1110 may comprise, at 1118, providing a vertical connector extending in the Z direction and being electrically coupled to the FM conductor.

As shown in FIG. 11, 1110 may comprise, at 1120, providing a backside BM layer disposed below the first FET in the Z direction and comprising a BM conductor extending in the X direction and being electrically coupled to the vertical connector.

In some aspects, process 1100 further includes providing an electrical connection from the FM conductor to at least one of the third S/D region, the fourth S/D region, or the second gate.

In some aspects, providing the first FET comprises providing a gate-all-around (GAA) FET comprising a first GAA region and wherein providing the second FET comprises providing a GAA FET comprising a second GAA region.

In some aspects, providing the first FET comprises providing a first plurality of nanosheet channels extending in the X direction and spaced apart from each other in the Z direction to from a first vertical stack, each channel connecting the first S/D region to the second S/D region through the first GAA region and being separated from the first GAA region by a first dielectric material, and providing the second FET comprises providing a plurality of nanosheet channels extending in the X direction and spaced apart from each other in the Z direction to from a second vertical stack disposed above the first vertical stack in the Z direction, each channel connecting the third S/D region to the fourth S/D region through the second GAA region, each nanosheet being separated from the second GAA region by a second dielectric material.

In some aspects, process 1100 further includes providing additional FM conductors to create a plurality of FM conductors extending in the X direction and spaced apart from each other along a Y direction, and providing additional BM conductors to create a plurality of BM conductors extending in the X direction and spaced apart from each other along the Y direction.

In some aspects, the plurality of FM conductors extending in the X direction consists of four or fewer FM conductors extending in the X direction.

In some aspects, the plurality of BM conductors extending in the X direction consists of four or fewer BM conductors extending in the X direction.

In some aspects, the plurality of FM conductors extending in the X direction consists of three or fewer FM conductors extending in the X direction.

In some aspects, the plurality of BM conductors extending in the X direction consists of three or fewer BM conductors extending in the X direction.

In some aspects, the process 1100 further includes providing a second vertical connector that electrically couples the second S/D region to the fourth S/D region by direct contact with both the second S/D region and the fourth S/D region.

In some aspects, process 1100 includes electrically coupling the second vertical connector to another of the plurality of FM conductors, another of the plurality of BM conductors, or both.

Process 1100 may include additional implementations, such as any single implementation or any combination of implementations described below and/or in connection with one or more other processes described elsewhere herein. Although FIG. 11 shows example blocks of process 1100, in some implementations, process 1100 may include additional blocks, fewer blocks, different blocks, or differently arranged blocks than those depicted in FIG. 11. Additionally, or alternatively, two or more of the blocks of process 1100 may be performed in parallel.

Figure 12:
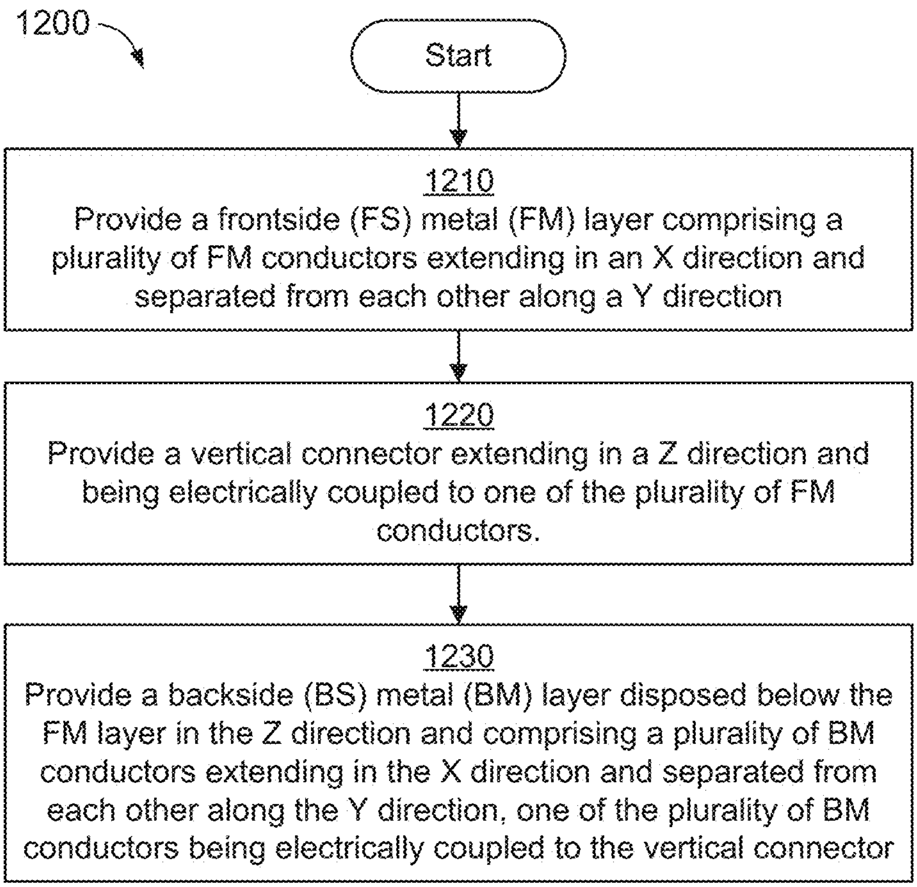
FIG. 12 is a flowchart of an example process for fabricating CFET circuits with vertical routing structures, according to aspects of the disclosure.

FIG. 12 is a flowchart of an example process 1200 for fabricating CFET circuits with vertical routing structures, according to aspects of the disclosure. As shown in FIG. 12, process 1200 may include, at 1210, providing an FM layer comprising a plurality of FM conductors extending in an X direction and separated from each other along a Y direction.

As further shown in FIG. 12, process 1200 may include, at 1220, providing a vertical connector extending in the Z direction and being electrically coupled to one of the plurality of FM conductors.

As further shown in FIG. 12, process 1200 may include, at 1230, providing a BM layer disposed below the FM layer in a Z direction and comprising a plurality of BM conductors extending in the X direction and separated from each other along the Y direction, one of the plurality of BM conductors being electrically coupled to the vertical connector.

Process 1200 may include additional implementations, such as any single implementation or any combination of implementations described below and/or in connection with one or more other processes described elsewhere herein. Although FIG. 12 shows example blocks of process 1200, in some implementations, process 1200 may include additional blocks, fewer blocks, different blocks, or differently arranged blocks than those depicted in FIG. 12. Additionally, or alternatively, two or more of the blocks of process 1200 may be performed in parallel.

Figure 13:
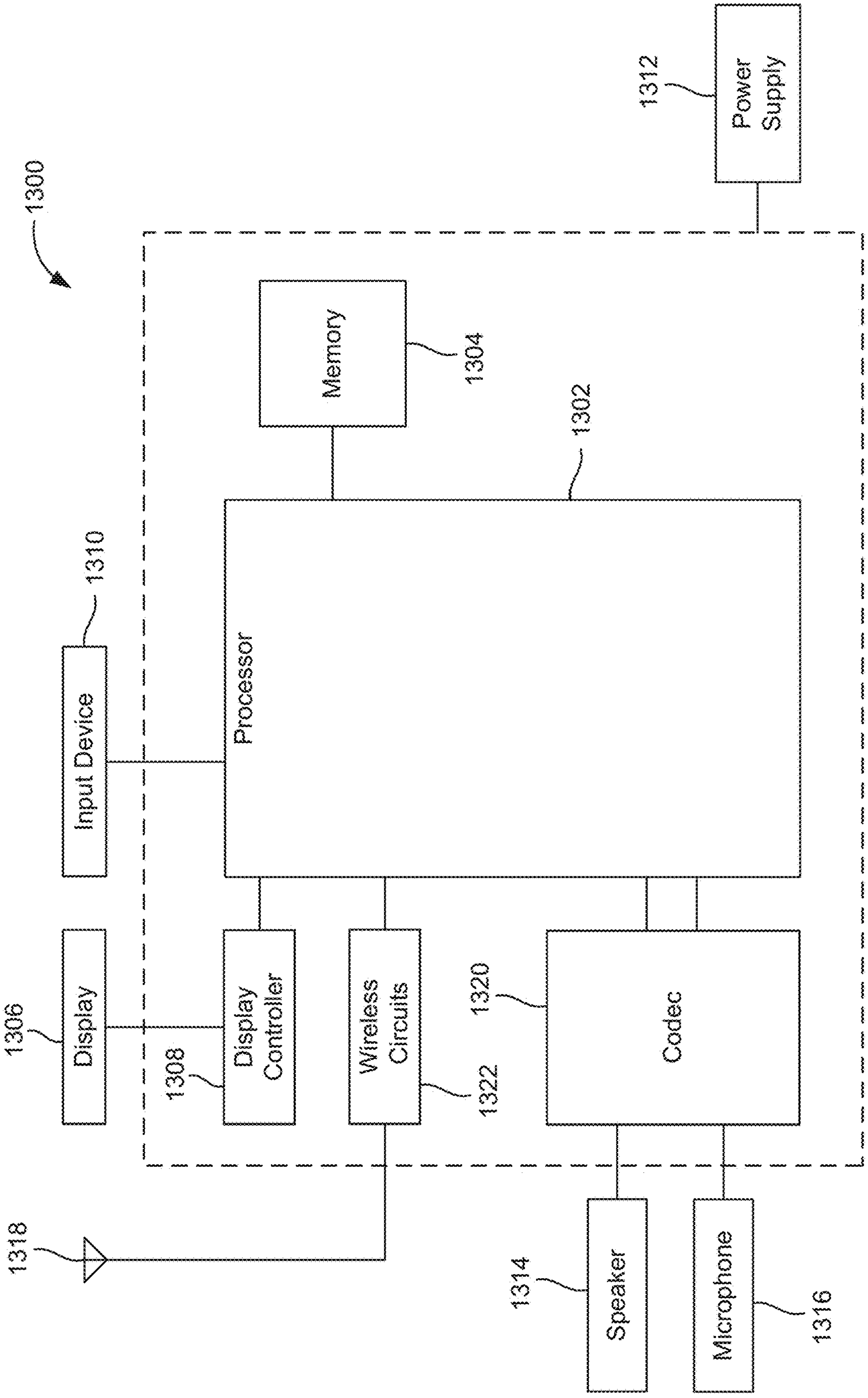
FIG. 13 illustrates a mobile device in accordance with some examples of the disclosure.

FIG. 13 illustrates a mobile device 1300, according to aspects of the disclosure. In some aspects, the mobile device 1300 may be implemented by including one or more IC devices manufactured based on the examples described in this disclosure.

In some aspects, mobile device 1300 may be configured as a wireless communication device. As shown, mobile device 1300 includes processor 1302. Processor 1302 may be communicatively coupled to memory 1304 over a link, which may be a die-to-die or chip-to-chip link. Mobile device 1300 also includes display 1306 and display controller 1308, with display controller 1308 coupled to processor 1302 and to display 1306. The mobile device 1300 may include input device 1310 (e.g., physical, or virtual keyboard), power supply 1312 (e.g., battery), speaker 1314, microphone 1316, and wireless antenna 1318. In some aspects, the power supply 1312 may directly or indirectly provide the supply voltage for operating some or all of the components of the mobile device 1300.

In some aspects, FIG. 13 may include coder/decoder (CODEC) 1320 (e.g., an audio and/or voice CODEC) coupled to processor 1302; speaker 1314 and microphone 1316 coupled to CODEC 1320; and wireless circuits 1322 (which may include a modem, RF circuitry, filters, etc.) coupled to wireless antenna 1318 and to processor 1302.

In some aspects, one or more of processor 1302, display controller 1308, memory 1304, CODEC 1320, and wireless circuits 1322 may include one or more IC devices including semiconductor structures manufactured according to the examples described in this disclosure.

It should be noted that although FIG. 13 depicts a mobile device 1300, similar architecture may be used to implement an apparatus including a set top box, a music player, a video player, an entertainment unit, a navigation device, a personal digital assistant (PDA), a fixed location data unit, a computer, a laptop, a tablet, a communications device, a mobile phone, or other similar devices.

Figure 14:
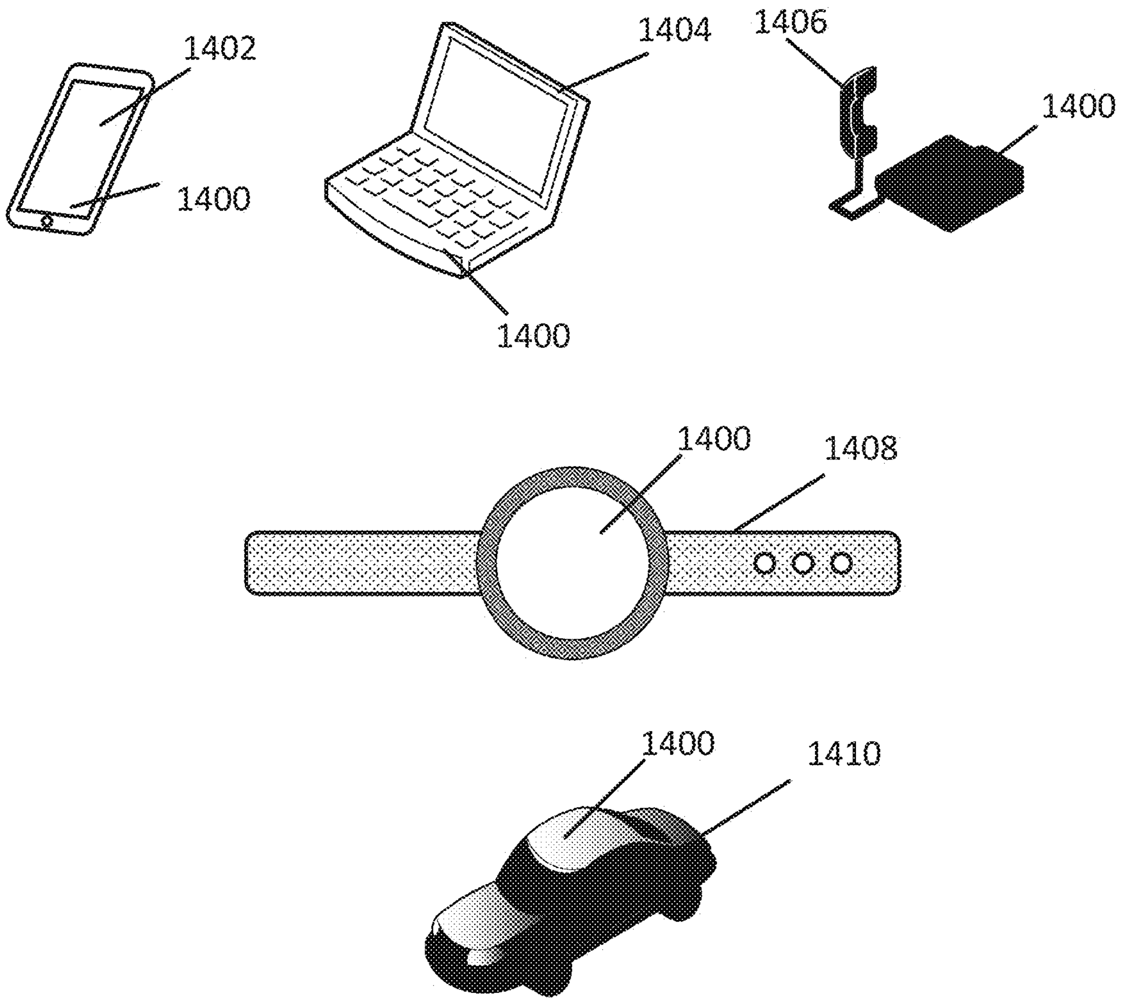
FIG. 14 illustrates various electronic devices that may be integrated with any of the aforementioned integrated device or semiconductor device in accordance with various examples of the disclosure.

FIG. 14 illustrates various electronic devices that may be integrated with any of the aforementioned devices, semiconductor devices, integrated circuit (IC) packages, integrated circuit (IC) devices, electronic components, interposer packages, package-on-package (PoP), System in Package (SiP), or System on Chip (SoC). For example, a mobile phone device 1402, a laptop computer device 1404, a fixed location terminal device 1406, a wearable device 1408, or automotive vehicle 1410 may include a semiconductor device 1400 (which may include semiconductor structures) as described herein. The devices 1402, 1404, 1406 and 1408 and the vehicle 1410 illustrated in FIG. 14 are merely exemplary. Other apparatuses or devices may also feature the semiconductor device 1400 including, but not limited to, a group of devices that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an integrated circuit device. The integrated circuit device may then be employed in devices described herein.

In the detailed descriptions herein, it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses:

Clause 1. A semiconductor structure, comprising: at least one CFET structure, comprising: a first FET of a first charge carrier type, comprising a first S/D region, a second S/D region, and a first gate; a second FET of a second charge carrier type, disposed above the first FET in a Z direction and comprising a third S/D region, a fourth S/D region, and a second gate; an FM layer disposed above the second FET in the Z direction and comprising an FM conductor extending in an X direction; a BM layer disposed below the first FET in the Z direction and comprising a BM conductor extending in the X direction; and a vertical connector extending in the Z direction, wherein the vertical connector electrically couples the BM conductor to the FM conductor.

Clause 2. The semiconductor structure of clause 1, wherein the FM conductor is electrically coupled to at least one of the third S/D region, the fourth S/D region, or the second gate.

Clause 3. The semiconductor structure of any of clauses 1 to 2, wherein the first gate comprises a first GAA structure comprising a first GAA region and wherein the second gate comprises a second GAA structure comprising a second GAA region.

Clause 4. The semiconductor structure of clause 3, wherein: the first FET comprises a first plurality of nanosheet channels extending in the X direction and spaced apart from each other in the Z direction to from a first vertical stack, each channel electrically coupling the first S/D region to the second S/D region through the first GAA region and being separated from the first GAA region by a first dielectric material; and the second FET comprises a second plurality of nanosheet channels extending in the X direction and spaced apart from each other in the Z direction to from a second vertical stack disposed above the first vertical stack in the Z direction, each channel electrically coupling the third S/D region to the fourth S/D region through the second GAA region and being separated from the second GAA region by a second dielectric material.

Clause 5. The semiconductor structure of any of clauses 1 to 4, wherein the vertical connector provides a first supply voltage from the BM conductor to the FM conductor.

Clause 6. The semiconductor structure of any of clauses 1 to 5, wherein the semiconductor structure comprises a standard cell, wherein the FM conductor is one of a plurality of FM conductors extending in the X direction and spaced apart from each other along a Y direction, and wherein the BM conductor is one of a plurality of BM conductors extending in the X direction and spaced apart from each other along the Y direction.

Clause 7. The semiconductor structure of clause 6, wherein the plurality of FM conductors extending in the X direction consists of four or fewer FM conductors extending in the X direction.

Clause 8. The semiconductor structure of any of clauses 6 to 7, wherein the plurality of BM conductors extending in the X direction consists of four or fewer BM conductors extending in the X direction.

Clause 9. The semiconductor structure of any of clauses 6, wherein the plurality of FM conductors extending in the X direction consists of three or fewer FM conductors extending in the X direction.

Clause 10. The semiconductor structure of any of clauses 6 and 9, wherein the plurality of BM conductors extending in the X direction consists of three or fewer BM conductors extending in the X direction.

Clause 11. The semiconductor structure of any of clauses 6 to 10, further comprising a second vertical connector that electrically couples the second S/D region to the fourth S/D region by direct contact with both the second S/D region and the fourth S/D region.

Clause 12. The semiconductor structure of clause 11, wherein the second vertical connector is electrically coupled to another of the plurality of FM conductors, another of the plurality of BM conductors, or both.

Clause 13. A semiconductor structure, comprising: an FM layer comprising a plurality of FM conductors extending in an X direction and separated from each other along a Y direction; a BM layer disposed below the FM layer in a Z direction and comprising a plurality of BM conductors extending in the X direction and separated from each other along the Y direction; and a vertical connector extending in the Z direction, wherein the vertical connector electrically couples a first BM conductor of the plurality of BM conductors to a first FM conductor of the plurality of FM conductors.

Clause 14. The semiconductor structure of clause 13, wherein the first BM conductor provides a first supply voltage to the semiconductor structure and wherein the vertical connector provides the first supply voltage from the first BM conductor to the first FM conductor.

Clause 15. The semiconductor structure of clause 14, wherein a second BM conductor of the plurality of BM conductors provides a second supply voltage to the semiconductor structure.

Clause 16. A method of fabricating a semiconductor structure, the method comprising: providing at least one CFET structure, comprising: providing a first FET of a first charge carrier type, comprising a first S/D region, a second S/D region, and a first gate; providing a second FET of a second charge carrier type, disposed above the first FET in a Z direction and comprising a third S/D region, a fourth S/D region, and a second gate; providing an FM layer disposed above the second FET in the Z direction and comprising an FM conductor extending in an X direction; providing a vertical connector extending in the Z direction and being electrically coupled to the FM conductor; and providing a BM layer disposed below the first FET in the Z direction and comprising a BM conductor extending in the X direction and being electrically coupled to the vertical connector.

Clause 17. The method of clause 16, further comprising providing an electrical connection from the FM conductor to at least one of the third S/D region, the fourth S/D region, or the second gate.

Clause 18. The method of any of clauses 16 to 17, wherein providing the first FET comprises providing a GAA FET comprising a first GAA region and wherein providing the second FET comprises providing a GAA FET comprising a second GAA region.

Clause 19. The method of clause 18, wherein: providing the first FET comprises providing a first plurality of nanosheet channels extending in the X direction and spaced apart from each other in the Z direction to from a first vertical stack, each channel electrically coupling the first S/D region to the second S/D region through the first GAA region and being separated from the first GAA region by a first dielectric material; and providing the second FET comprises providing a plurality of nanosheet channels extending in the X direction and spaced apart from each other in the Z direction to from a second vertical stack disposed above the first vertical stack in the Z direction, each channel electrically coupling the third S/D region to the fourth S/D region through the second GAA region and being separated from the second GAA region by a second dielectric material.

Clause 20. The method of any of clauses 16 to 19, further comprising: providing additional FM conductors to create a plurality of FM conductors extending in the X direction and spaced apart from each other along a Y direction; and providing additional BM conductors to create a plurality of BM conductors extending in the X direction and spaced apart from each other along the Y direction.

Clause 21. The method of clause 20, wherein the plurality of FM conductors extending in the X direction consists of four or fewer FM conductors extending in the X direction.

Clause 22. The method of any of clauses 20 to 21, wherein the plurality of BM conductors extending in the X direction consists of four or fewer BM conductors extending in the X direction.

Clause 23. The method of any of clauses 20, wherein the plurality of FM conductors extending in the X direction consists of three or fewer FM conductors extending in the X direction.

Clause 24. The method of any of clauses 20 and 23, wherein the plurality of BM conductors extending in the X direction consists of three or fewer BM conductors extending in the X direction.

Clause 25. The method of any of clauses 20 to 24, further comprising providing a second vertical connector that electrically couples the second S/D region to the fourth S/D region by direct contact with both the second S/D region and the fourth S/D region.

Clause 26. The method of clause 25, further comprising electrically coupling the second vertical connector to another of the plurality of FM conductors, another of the plurality of BM conductors, or both.

Clause 27. A method of fabricating a semiconductor structure, the method comprising: providing an FM layer comprising a plurality of FM conductors extending in an X direction and separated from each other along a Y direction; providing a vertical connector extending in a Z direction and being electrically coupled to one of the plurality of FM conductors; and providing a BM layer disposed below the FM layer in the Z direction and comprising a plurality of BM conductors extending in the X direction and separated from each other along the Y direction, one of the plurality of BM conductors being electrically coupled to the vertical connector.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a DSP, an ASIC, an FPGA, or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A semiconductor structure, comprising:

at least one complementary field effect transistor (CFET) structure, comprising:

a first field effect transistor (FET) of a first charge carrier type, comprising a first source/drain (S/D) region, a second S/D region, and a first gate;

a second FET of a second charge carrier type, disposed above the first FET in a Z direction and comprising a third S/D region, a fourth S/D region, and a second gate;

a frontside (FS) metal (FM) layer disposed above the second FET in the Z direction and comprising an FM conductor extending in an X direction;

a backside (BS) metal (BM) layer disposed below the first FET in the Z direction and comprising a BM conductor extending in the X direction; and a vertical connector extending in the Z direction, wherein the vertical connector electrically couples the BM conductor to the FM conductor; and a second vertical connector that electrically couples the second S/D region to the fourth S/D region by direct contact with both the second S/D region and the fourth S/D region, wherein the semiconductor structure comprises a standard cell, wherein the FM conductor is one of a plurality of FM conductors extending in the X direction and spaced apart from each other along a Y direction, and wherein the BM conductor is one of a plurality of BM conductors extending in the X direction and spaced apart from each other along the Y direction.

2. The semiconductor structure of claim 1, wherein the FM conductor is electrically coupled to at least one of the third S/D region, the fourth S/D region, or the second gate.

3. The semiconductor structure of claim 1, wherein the first gate comprises a first gate-all-around (GAA) structure comprising a first GAA region and wherein the second gate comprises a second GAA structure comprising a second GAA region.

4. The semiconductor structure of claim 3, wherein:

the first FET comprises a first plurality of nanosheet channels extending in the X direction and spaced apart from each other in the Z direction to form a first vertical stack, each channel electrically coupling the first S/D region to the second S/D region through the first GAA region and being separated from the first GAA region by a first dielectric material; and the second FET comprises a second plurality of nanosheet channels extending in the X direction and spaced apart from each other in the Z direction to form a second vertical stack disposed above the first vertical stack in the Z direction, each channel electrically coupling the third S/D region to the fourth S/D region through the second GAA region and being separated from the second GAA region by a second dielectric material.

5. The semiconductor structure of claim 1, wherein the vertical connector provides a first supply voltage from the BM conductor to the FM conductor.

6. The semiconductor structure of claim 1, wherein the plurality of FM conductors extending in the X direction consists of four or fewer FM conductors extending in the X direction.

7. The semiconductor structure of claim 1, wherein the plurality of BM conductors extending in the X direction consists of four or fewer BM conductors extending in the X direction.

8. The semiconductor structure of claim 1, wherein the plurality of FM conductors extending in the X direction consists of three or fewer FM conductors extending in the X direction.

9. The semiconductor structure of claim 1, wherein the plurality of BM conductors extending in the X direction consists of three or fewer BM conductors extending in the X direction.

10. The semiconductor structure of claim 1, wherein the second vertical connector is electrically coupled to another of the plurality of FM conductors, another of the plurality of BM conductors, or both.

11. A method of fabricating a semiconductor structure, the method comprising:

providing at least one complementary field effect transistor (CFET) structure, comprising:

providing a first field effect transistor (FET) of a first charge carrier type, comprising a first S/D region, a second S/D region, and a first gate;

providing a second FET of a second charge carrier type, disposed above the first FET in a Z direction and comprising a third S/D region, a fourth S/D region, and a second gate;

providing a frontside (FS) metal (FM) layer disposed above the second FET in the Z direction and comprising an FM conductor extending in an X direction;

providing a vertical connector extending in the Z direction and being electrically coupled to the FM conductor; and providing a backside (BS) metal (BM) layer disposed below the first FET in the Z direction and comprising a BM conductor extending in the X direction and being electrically coupled to the vertical connector, providing additional FM conductors to create a plurality of FM conductors extending in the X direction and spaced apart from each other along a Y direction;

providing additional BM conductors to create a plurality of BM conductors extending in the X direction and spaced apart from each other along the Y direction; and providing a second vertical connector that electrically couples the second S/D region to the fourth S/D region by direct contact with both the second S/D region and the fourth S/D region.

12. The method of claim 11, further comprising providing an electrical connection from the FM conductor to at least one of the third S/D region, the fourth S/D region, or the second gate.

13. The method of claim 11, wherein providing the first FET comprises providing a gate-all-around (GAA) FET comprising a first GAA region and wherein providing the second FET comprises providing a GAA FET comprising a second GAA region.

14. The method of claim 13, wherein:

providing the first FET comprises providing a first plurality of nanosheet channels extending in the X direction and spaced apart from each other in the Z direction to form a first vertical stack, each channel electrically coupling the first S/D region to the second S/D region through the first GAA region and being separated from the first GAA region by a first dielectric material; and providing the second FET comprises providing a second plurality of nanosheet channels extending in the X direction and spaced apart from each other in the Z direction to form a second vertical stack disposed above the first vertical stack in the Z direction, each channel electrically coupling the third S/D region to the fourth S/D region through the second GAA region and being separated from the second GAA region by a second dielectric material.

15. The method of claim 11, wherein the plurality of FM conductors extending in the X direction consists of four or fewer FM conductors extending in the X direction.

16. The method of claim 11, wherein the plurality of BM conductors extending in the X direction consists of four or fewer BM conductors extending in the X direction.

17. The method of claim 11, wherein the plurality of FM conductors extending in the X direction consists of three or fewer FM conductors extending in the X direction.

18. The method of claim 11, wherein the plurality of BM conductors extending in the X direction consists of three or fewer BM conductors extending in the X direction.

19. The method of claim 11, further comprising electrically coupling the second vertical connector to another of the plurality of FM conductors, another of the plurality of BM conductors, or both.

* * * * *